United States Patent [19]
Yokoyama

[11] 4,100,438
[45] Jul. 11, 1978

[54] COMPOUND TRANSISTOR CIRCUITRY

[75] Inventor: Kenji Yokoyama, Hamamatsu, Japan

[73] Assignee: Nippon Gakki Seizo Kabushiki Kaisha, Hamamatsu, Japan

[21] Appl. No.: 604,762

[22] Filed: Aug. 14, 1975

[30] Foreign Application Priority Data

Aug. 21, 1974 [JP] Japan .................................. 49-95897
Aug. 21, 1974 [JP] Japan .................................. 49-95900

[51] Int. Cl.² ...................... H03F 3/16; H03K 3/353; H01L 29/80
[52] U.S. Cl. .................................. 307/304; 307/251; 330/277; 357/22
[58] Field of Search ................... 307/251, 304; 330/35, 330/38 M, 94, 277; 357/22

[56] References Cited

U.S. PATENT DOCUMENTS

| 3,767,946 | 10/1973 | Berger et al. ........................ 307/304 |
| 3,828,230 | 8/1974 | Nishizawa et al. .................... 352/22 |
| 3,927,383 | 12/1975 | Fjarlie et al. ........................ 330/35 X |

OTHER PUBLICATIONS

Csanky et al., "Combining FETs for Higher Gains"; *Electronic Design*, pp. 36–44, 9/27/1963.
"Cascode Field Effect Transistor Applications"; *Amelco Semiconductor; Division of Teledyne, Inc.;* Tech. Notes No. 5, pp. 1–14; 10/1963.
Wyland, "FET Cascode Technique Optimizes Differential Amplifier Performance"; *Electronics;* pp. 81–84; 1/18/1971.
Evan-Hart, "The Replacement of Thermionic Valves by Junction Field Effect Hybrid Circuits"; *Electronics Components* (pub); vol. 14, No. 2, pp. 78–81; 1/26/73.

*Primary Examiner*—Larry N. Anagnos
*Attorney, Agent, or Firm*—Cushman, Darby & Cushman

[57] ABSTRACT

A compound transistor circuitry having an output characteristic resembling that of a pentode vacuum tube comprises: a first field effect transistor having a saturated-type output characteristic resembling that of a pentode vacuum tube; and a second field effect transistor having an unsaturated-type output characteristic resembling that of a triode vacuum tube. The first and second field effect transistors have a conducting channel of a single and same conductivity type, respectively. The second field effect transistor is connected in series with the drain current path of the first field effect transistor. This second field effect transistor is rendered conductive only when the drain-source voltage of the first field effect transistor exceeds its pinch-off voltage.

20 Claims, 7 Drawing Figures

COMPOUND TRANSISTOR CIRCUITRY

BACKGROUND OF THE INVENTION

1. Field of the Invention

The present invention pertains to a compound transistor circuitry comprising a combination of saturated-type field effect transistor and an unsaturated-type field effect transistor and having a saturated-type output characteristic resembling that of a pentode vacuum tube.

2. Description of the Prior Art

In order to improve, for example, the breakdown voltage of a horizontal junction-type field effect transistor having a saturated-type output characteristic resembling that of a pentode vacuum tube, there has been proposed a compound transistor circuitry consisting of two horizontal junction-type field effect transistors which are connected in the so-called cascode configuration. This known compound transistor circuitry employs, as the transistor used on the input side, a horizontal junction-type field effect transistor having a high transconductance $gm$, and, as the transistor used on the output side, a horizontal junction-type field effect transistor having a high breakdown voltage characteristic, to thereby bring forth a function characterized by a high transconductance $gm$ and a high breakdown voltage. However, it is difficult to produce a horizontal junction-type field effect transistor having a high breakdown voltage characteristic because of the fact that its breakdown voltage level is subjected to limitation from the structural point of view. For this reason, the upper limit of the breakdown voltage of a compound transistor circuitry using a horizontal junction-type field effect transistor has been accepted to be 500 V for practical purposes. Such a known compound transistor circuitry has a saturated-type output characteristic resembling that of a pentode vacuum tube, but it has trailing problems such that the gate voltage - drain current linearity is not very good and that the build-up characteristic of the drain current (output current), meaning the uprising characteristic of the drain current from zero till saturation, is not sharp.

Also, a compound transistor circuitry using, as the transistor on the output side, a vertical field effect transistor having an unsaturated-type output characteristic resembling that of a triode vacuum tube has been proposed already by Takashi YOSHIDA and Takeshi MATSUYAMA and filed for a patent entitled "COMPOUND FIELD EFFECT TRANSISTOR" in U.S.A. on July 30, 1975, Ser. No. 600,476, and assigned to the same assignee. This compound transistor circuitry of the prior art is capable of elevating the breakdown voltage of the vertical field effect transistor to a considerably high level, and accordingly, it is possible to obtain a breakdown voltage as high as about 1000 V. Nevertheless, various drawbacks which are peculiar to this known compound transistor circuitry, with the exception of the advantage concerning the aforesaid high breakdown voltage characteristic, have not yet been improved.

SUMMARY OF THE INVENTION

It is, therefore, a primary object of the present invention to provide a compound transistor circuitry having a good linearity of the gate voltage-drain current characteristic and having a high breakdown voltage characteristic.

Another object of the present invention is to provide a compound transistor circuitry of the type described above, which has a sharp drain current (output current) build-up feature in the drain current versus drain voltage characteristic.

Still another object of the present invention is to provide a compound transistor circuitry of the type described above, which is good in its high frequency characteristic.

These and other objects as well as the attendant advantages of the present invention will become apparent by reading the following detailed description of the preferred embodiments of the present invention when taken in conjunction with the accompanying drawings.

DETAILED DESCRIPTION OF THE PREFERRED EMBODIMENTS

Figure 1:
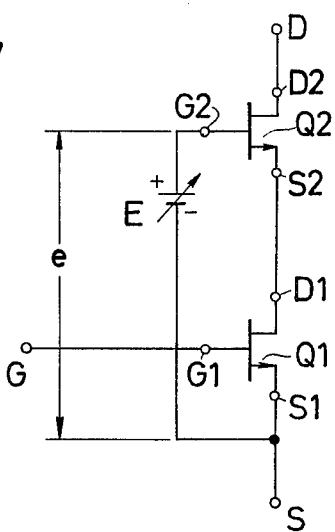
FIG. 1 is an electric circuit diagram showing an example of the compound transistor circuitry according to the present invention.

The compound transistor circuitry according to the present invention is of the arrangement that a first field effect transistor and a second field effect transistor both having a conducting channel of a same conductivity type are connected together in a cascode configuration. This first field effect transistor which is used on the input side is a horizontal junction-type field effect transistor having a saturated-type output characteristic resembling that of a pentode vacuum tube. The second field effect transistor which is used on the output side is an unsaturated-type vertical junction-type field effect transistor having an unsaturated-type output characteristic resembling that of a triode vacuum tube. The second field effect transistor is constructed to be operative so that it will plunge into its conducting state at the point when the drain-source voltage of the first field effect transistor exceeds its pinch-off voltage.

As a means for insuring the second field effect transistor to function so that it will start plunging into its conducting state, it will be necessary to provide a voltage source which is assigned to provide a required potential difference between the gate electrode of the second field effect transistor and the source electrode of the first field effect transistor, or alternatively to use, as the second field effect transistor, a vertical junction-type field effect transistor having its cut-off voltage level which is higher than the pinch-off voltage level of the first field effect transistor.

As stated above, the compound field effect transistor is operative so that the second field effect transistor which is used on the output side will not be rendered conductive until the first field effect transistor on the input side becomes substantially saturated. Accordingly, the build-up characteristic of the output current of the compound transistor circuitry according to the present invention depends solely on the drain voltage - drain current characteristic of the second field effect transistor which is used on the output side, and as a result the build-up characteristic of this compound transistor circuitry becomes extremely sharp. Also, the compound transistor circuitry according to the present invention functions so that it will not give out any output current when the first field effect transistor on the input side remains to be in its unsaturated range of poor linearity, and that it will give out an output current only in the state of the first field effect transistor in which this transistor has become substantially saturated and the compound transistor circuitry now will substantially start its action. As such, the linearity of the input voltage - output current characteristic will become extremely good.

Furthermore, the compound transistor circuitry according to the present invention is a cascode connection of a horizontal junction-type field effect transistor on the input side and a vertical junction-type field effect transistor on the output side, as stated above. As a result, it is possible to obtain a very high level of breakdown voltage such as 1000 V. Also, as a general advantage of "cascode connection", there is brought about a decrease in the so-called Miller effect capacitance. Accordingly, it is possible to obtain a desirable high frequency function. Still more, the properties, such as transconductance $gm$, noise figure and internal resistance, of the compound transistor circuitry of the present invention are determined substantially by the ability of the first field effect transistor. Thus, by making an appropriate selection of the characteristics of the first field effect transistor, the aforesaid properties can be made extremely satisfactory ones. Thus, the compound transistor circuitry according to the present invention will exhibit a saturated-type output characteristic resembling that of a pentode vacuum tube, and its overall functions will be made far superior to those of the pentode vcuum tube.

Description will hereunder be made on some of the examples of the compound transistor circuitry according to the present invention.

In FIG. 1, there is shown an electric circuit diagram of a first example of the compound transistor circuitry according to the present invention. In this Figure, the drain electrode D1 of the first field effect transistor Q1 on the input side is connected in series with the source electrode S2 of the second field effect transistor Q2 on the output side. In other words, the second field effect transistor Q2 is connected in series with the drain current path of the first field effect transistor Q1. The gate electrode G1 and the source electrode S1 of the first field effect transistor Q1 are connected to the first terminal G which constitutes the signal input terminal of the compound transistor circuitry, and to the second terminal S which normally is used as the reference potential point, respectively. The drain electrode D2 of the second field effect transistor Q2 is connected to the third terminal D which constitutes the output terminal of the compound transistor circuitry. The gate electrode G2 of the second field effect transistor Q2 is connected, via a variable DC power source E, to the aforesaid second terminal S. In short, the compound transistor circuitry according to the present invention is of the arrangement, when viewed from the aspect of alternate current, that the field effect transistors Q1 and Q2 are connected together in cascode fashion. Accordingly, this circuitry can provide the advantages of a generally known circuitry of cascode connection.

Figure 2:
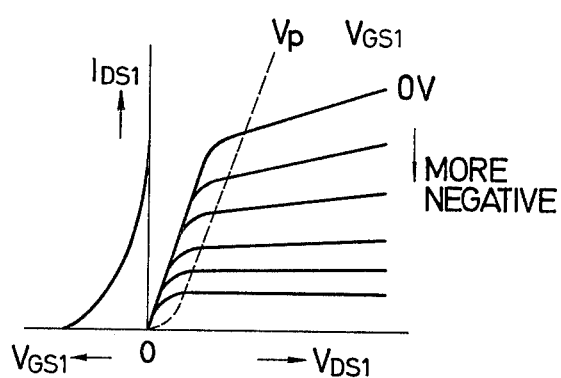
FIG. 2 is a chart showing the static characteristic of a horizontal junction-type field effect transistor employed in the present invention.
Figure 3:
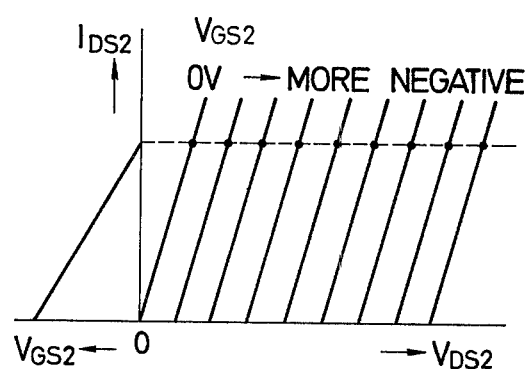
FIG. 3 is a chart showing the static characteristic of a vertical junction-type field effect transistor employed in the present invention.

Said first field effect transistor Q1 is of a saturated-type output characteristic resembling that of a pentode vacuum tube, as shown in the chart of static characteristic of FIG. 2. Thus, this first field effect transistor is, for example, a known horizontal junction-type field effect transistor having an n-type conducting channel. The second field effect transistor Q2, on the other hand, is of an unsaturated-type output characteristic resembling that of a triode vacuum tube as shown in the chart of static characteristic in FIG. 3. Thus, this second field effect transistor is, for example, a known vertical junction-type field effect transistor having an n-type conducting channel.

In the arrangement of the compound transistor circuitry described above, let us now suppose an instance where-in the output voltage $e$ of the variable DC voltage source E is zero, i.e. an instance wherein the gate electrode G2 is short-circuited to the source electrode S1. In such an instance, the gate-source voltage $V_{GS2}$ of the second field effect transistor Q2 is equal (in magnitude and not in polarity) to the drain-source voltage $V_{DS1}$ of the first field effect transistor Q1. Accordingly, when the cut-off voltage of the second field effect transistor Q2 (meaning the gate-source voltage $V_{GS2}$ immediately before the drain current $I_{DS2}$ begins to flow) is lower than the pinch-off voltage $V_P$ of the first field effect transistor Q1, the second field effect transistor Q2 will be rendered conductive throughout the unsaturated action range of the first field effect transistor Q1. Accordingly, the input voltage $V_{DS}$ - output current $I_{DS}$ characteristic of the compound transistor circuitry exhibits a poor linearity, and also the build-up of the output current $I_{DS}$ loses sharpness. As a result, the overall characteristics of the compound transistor circuitry will exhibit a pattern close to that shown in FIG. 2. This fact may be said as being the cause for the development of the various drawbacks peculiar to the afore-mentioned compound transistor circuitry which has been proposed in the past.

In the compound transistor circuitry according to the present invention, the second field effect transistor Q2 is constructed so as to have the property that it will be rendered conductive only after the first field effect transistor Q1 has reached its range of saturation. Concretely speaking, between the gate electrode G2 of the second field effect transistor Q2 and the second terminal S of the compound transistor circuitry is provided a biasing voltage $e$ by a variable DC voltage source E in order to insure the operation that the second field effect transistor Q2 is rendered conductive only after the first field effect transistor Q1 has reached its range of saturation, i.e. only after the drain-source voltage $V_{DS1}$ of the first field effect transistor Q1 has reached its pinch-off voltage $V_P$. By so arranging, the second field effect transistor Q2 can be rendered conductive only when the first field effect transistor Q1 is in its saturated state. At such a time, the overall characteristics of the compound transistor circuitry will become as shown in FIG. 4.

Figure 4:
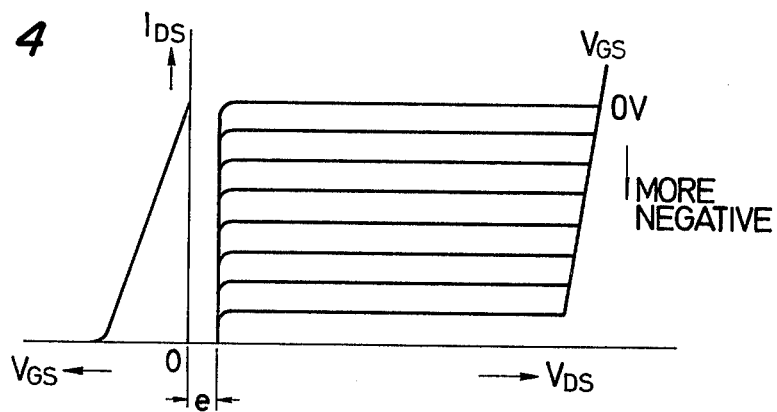
FIG. 4 is a chart showing the static characteristic of the compound transistor of the present invention.

As will be understood from FIG. 4, the compound transistor circuitry according to the present invention has the features that the build-up of its output current $I_{DS}$ is extremely sharp and that the linearity of the input voltage $V_{GS}$ - output current $I_{DS}$ characteristic is extremely good.

In the aforesaid first example, a variable DC voltage source E is connected between the gate electrode G2 of the second field effect transistor Q2 and the second terminal S of the compound transistor circuitry to provide a biasing voltage e between said gate electrode G2 and said second terminal S, so that the second field effect transistor Q2 begins to become conductive after the first field effect transistor Q1 substantially has entered into its saturated action range.

However, in case the cut-off voltage of the second field effect transistor Q2 is higher than the pinch-off voltage $V_P$ of the first field effect transistor Q1, it is possible to set the aforesaid biasing voltage e at zero. In other words, the gate electrode G2 of the second field effect transistor Q2 can be connected directly either to the source electrode S1 of the first field effect transistor Q1 or to the second terminal S. In case this latter arrangement is adopted, the fabrication of the compound transistor circuitry in the form of an integrated circuitry becomes easy.

Figure 5:
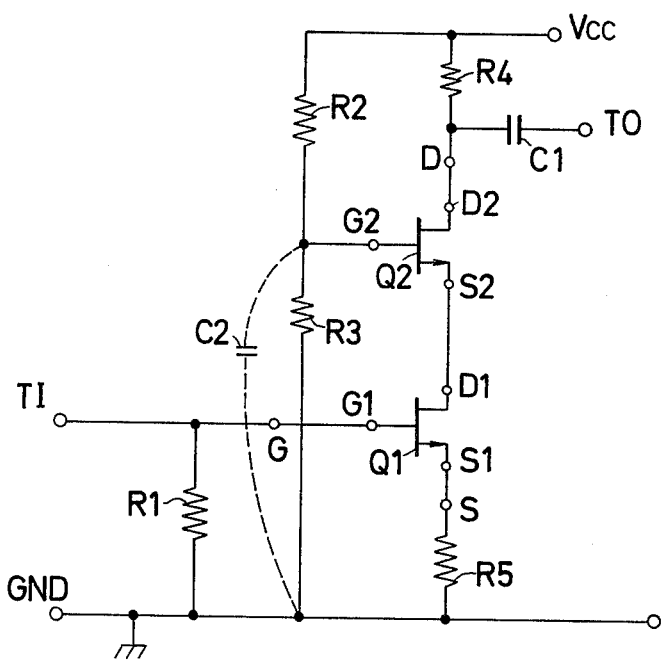
FIG. 5 is an electric circuit diagram showing another example of the compound transistor circuitry according to the present invention.

FIG. 5 shows an example of amplifier formed with the compound transistor circuitry of the present invention. A third terminal D is connected, via a resistor R4, to an actuator voltage source $V_{cc}$, and further to the output terminal TO of an amplifier via a capacitor C1. The second terminal S is grounded via a resistor R5. The first terminal G is connected to the signal input terminal T1 of the amplifier and is grounded via a resistor R1. A series circuit of resistors R2 and R3 is connected between the actuator voltage source $V_{cc}$ and the ground. The gate electrode G2 of the second field effect transistor Q2 is connected to a point of connection between the resistor R2 and the resistor R3. More specifically, the voltage of the actuator voltage source $V_{cc}$ is divided by a voltage divider circuit network which is comprised of the resistors R2 and R3, and the divided voltage is applied to the gate electrode G2 of said second field effect transistor Q2. Thus, this voltage divider circuit network and the actuator voltage source $V_{cc}$ jointly exert the role of the variable DC voltage source E in FIG. 1. In this instant example, however, the biasing voltage e which is applied between the gate electrode G2 of the second field effect transistor Q2 and the source electrode S1 of the first field effect transistor Q1 is not able to vary.

It should be understood that, wherever required, a capacitor C2 may be connected between the gate electrode G2 of the second field effect transistor Q2 and the ground so that the gate electrode G2 of said second field effect transistor Q2 may be grounded for a signal frequency applied i.e. from an AC viewpoint.

In case of the following conditions: that the breakdown voltage of the second field effect transistor Q2 is 1000 V; that the breakdown voltage of the first field effect transistor Q1 is 30 V; that the transconductance gm is 2 mΩ; and that the resistance of a load resistor R4 is 500 kΩ, the voltage gain of the amplifier of this instant example will reach as large as 60 dB, and a maximum output of 300 Vrms can be obtained.

Figure 6:
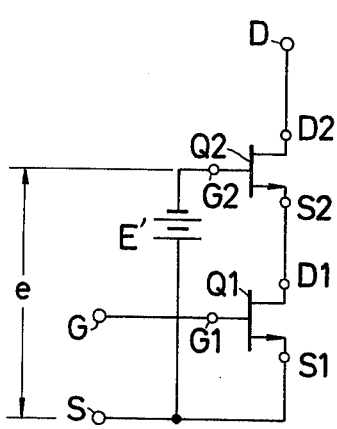
FIG. 6 is an electric circuit diagram showing a modified example of the compound transistor circuitry embodying the present invention.

Referring now to FIG. 6, an interesting modified example of the compound transistor circuitry is described hereunder.

Figure 7:
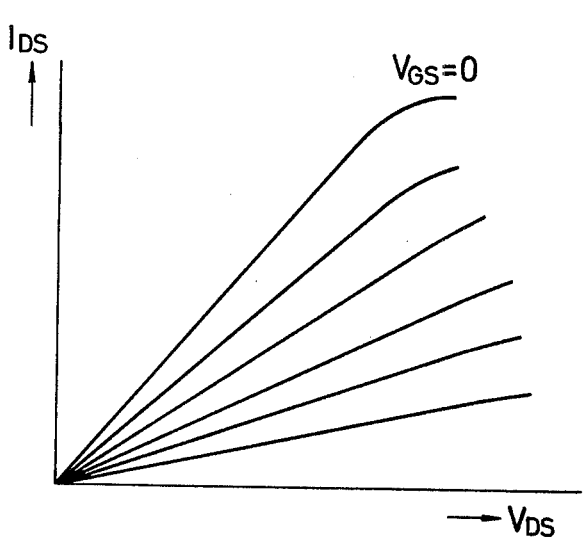
FIG. 7 is a chart showing the output characteristic of the compound transistor circuitry of the present invention shown in FIG. 6.

This modified example is arranged to be operative so that, when the drain-source voltage of the first field effect transistor Q1 assumes a value lower than its pinch-off voltage level, i.e. in the state of the first field effect transistor Q1 not having become saturated, the second field effect transistor Q2 is caused to begin to become conductive. By so arranging, the compound transistor circuitry will have such an output characteristic that the range of saturation of this circuitry is expanded, as shown in FIG. 7. And, the internal resistance across the second terminal S and the third terminal D in said expanded range of saturation can be varied through a broad range by varying the voltage $V_{GS}$ across the first terminal G and the second terminal S. Accordingly, the compound transistor circuitry of this example can be used as a variable resistance element having a large dynamic range.

In order to cause the second field effect transistor Q2 to begin to become conductive under the aforesaid conditions, there is provided a fixed or a variable DC voltage source E' to provide a biasing voltage between the gate electrode G2 of the second field effect transistor Q2 and either the source electrode S1 of the first field effect transistor Q1 or the second terminal S. In case, however, the cut-off voltage of the second field effect transistor Q2 takes a value lower than the pinch-off voltage of the first field effect transistor Q1, it is possible to directly connect the gate electrode G2 of the second field effect transistor Q2 to either the source electrode S1 of the first field effect transistor Q1 or the second terminal S without the provision of said DC voltage source E'. This latter arrangement is advantageous in making the compound transistor circuitry in the form of an integrated circuitry.

It should be noted that the DC voltage source E' shown in FIG. 6 has an output voltage polarity which is the opposite of the output voltage polarity of the DC voltage source E shown in FIG. 1.

Description has been made on examples wherein the first and the second field effect transistors Q1 and Q2 employ field effect transistors of an n-channel type. It is needless to say that these two field effect transistors Q1 and Q2 can employ p-channel type field effect transistors to construct the compound transistor circuitry of the present invention. It should be understood also that the DC voltage sources E and E' can be constructed by the use of such elements as constant voltage elements.

I claim:

1. A compound transistor circuitry comprising:
   a first field effect transistor having a gate electrode, a source electrode and a drain electrode and having a saturated-type output characteristic resembling that of a pentode vacuum tube;
   a second field effect transistor having a gate electrode, a source electrode and a drain electrode and having an unsaturating-type output characteristic resembling that of a triode vacuum tube and being connected in series to the drain current path of said first field effect transistor;
   a first terminal connected to the gate electrode of said first field effect transistor;
   a second terminal connected to the source electrode of said first field effect transistor;
   a third terminal connected to the drain electrode of said second field effect transistor; and
   a biasing voltage source connected between said gate electrode of said second field effect transistor and said second terminal for providing a biasing voltage across said gate electrode of said second field effect transistor and said second terminal, said first field effect transistor having a conducting channel of a certain conductivity type which is identical with the conductivity type of the conducting channel of said second field effect transistor, said biasing voltage having a magnitude and a polarity enabling said second field effect transistor only to become and remain conductive with its said unsaturating-type output characteristic during the state of the drain-source voltage of said first field effect transistor exceeding its pinch-off voltage level.

2. A compound transistor circuitry according to claim 1, in which:
the drain electrode of said first field effect transistor is directly connected to the source electrode of said second field effect transistor.

3. A compound transistor circuitry according to claim 1, in which:
said biasing voltage source is a direct current voltage source.

4. A compound transistor circuitry according to claim 1, in which:
said biasing voltage source is a variable direct current voltage source.

5. A compound transistor circuitry according to claim 1, in which:
said first field effect transistor is a horizontal junction-type field effect transistor, and said second field effect transistor is a vertical junction-type field effect transistor.

6. A compound transistor circuitry according to claim 1, in which:
said biasing voltage source comprises a voltage divider circuit network formed with a plural number of resistors and a direct current voltage source connected to said voltage divider circuit network.

7. A compound transistor circuitry according to claim 1, in which:
said second field effect transistor has a cut-off voltage higher than the pinch-off voltage level of said first field effect transistor, and said biasing voltage is zero.

8. A compound transistor circuitry according to claim 1, in which:
said first field effect transistor and said second field effect transistor are of an n-type conductivity channel, and
the polarity of said biasing voltage is positive.

9. A compound field effect transistor having an improved pentode type operating characteristic comprising:
a first junction type field effect transistor having a saturated drain current to drain voltage characteristic and a given pinch-off drain voltage level, said transistor having a first gate electrode for receiving an input signal, a first source electrode and a first drain electrode,
means including a second junction type field effect transistor having an unsaturating drain current to drain voltage characteristic for steepening the output current characteristic of the compound transistor while improving its input voltage versus output current characteristic by causing said second transistor to start and remain conductive in accordance with said unsaturating characteristic only after and during the time that said first transistor exceeds its said pinch-off drain voltage level,
said second transistor having a second gate electrode, a second source electrode and a second drain electrode,
said first drain electrode being connected to said second source electrode, and
said first source and second drain electrodes being the output electrodes for exhibiting said steepened and improved characteristic of said compound transistor.

10. A compound transistor as in claim 9 including biasing means connected between said first source electrode and second gate electrode for forwardly biasing said second transistor to a voltage which prevents conduction of said second transistor until the drain-source voltage of said first transistor has exceeded its said pinch-off voltage level.

11. A compound transistor as in claim 9 wherein said means includes a direct connection between said first source electrode and second gate electrode and wherein the gate-source voltage of said second transistor is higher than said pinch-off drain voltage level of the first transistor.

12. A compound transistor as in claim 11 wherein said second transistor is of the vertical type.

13. A compound field effect transistor having an improved pentode type operating characteristic comprising:
a first junction type field effect transistor having a saturated drain current to drain voltage characteristic and a given pinch-off drain voltage level, said first transistor having a gate electrode, a first source electrode and a first drain electrode,
means including a second junction type field effect transistor having an unsaturating drain current to drain voltage characteristic for steepening the output current characteristic of the compound transistor while improving its input voltage versus output current characteristic by causing said second transistor to start and remain conductive in accordance with said unsaturating characteristic only after and during the time that said first transistor exceeds its said pinch-off drain voltage level,
said second transistor having a second gate electrode, a second source electrode and a second drain electrode,
a first terminal,
a second terminal, and
a third terminal,
said first terminal being connected to said first source electrode and to second gate electrode,
said second terminal being connected to said second drain electrode,
said third terminal being connected to said first gate electrode for receivig an input signal,
said first drain electrode being connected to said second source electrode, and
said first and second terminals being the output terminals for exhibiting said steepened and improved characteristic of said compound transistor.

14. A compound transistor as in claim 13 including biasing means connected between said first source electrode and second gate electrode for forwardly biasing said second transistor to a voltage which prevents conduction of said second transistor until the drain-source voltage of said first transistor has exceeded its said pinch-off voltage level.

15. A compound transistor as in claim 13 wherein said means includes a direct connection between said first source electrode and second gate electrode and wherein the gate-source voltage of said second transistor is higher than said pinch-off drain voltage level of the first transistor.

16. A compound transistor as in claim 15 wherein said second transistor is of the vertical type.

17. A compound field effect transistor having a pentode type output characteristic with its initial slope decreased and the range of saturation expanded, comprising:
- a first junction type field effect transistor having a saturated drain current to drain voltage characteristic and having a first gate electrode, a first source electrode and a first drain electrode,
- means including a second junction type field effect transistor having an unsaturating drain current to drain voltage characteristic for decreasing the initial slope of the input voltage versus output current characteristic of the compound transistor and for also expanding its range of saturation by causing said second transistor to begin and remain conducting in accordance with said unsaturating characteristic before said first transistor becomes saturated, said second transistor having a second gate electrode, a second source electrode and a second drain electrode,
- a first terminal,
- a second terminal, and
- a third terminal,
- said first terminal being connected to said first source electrode and to said second gate electrode,
- said second terminal being connected to said second drain electrode,
- said third terminal being connected to said first gate electrode for receiving an input signal,
- said first drain electrode being connected to said second source electrode, and
- said first and second terminals being the output terminals for exhibiting the decreased initial slope and expanded saturation range characteristic of said compound transistor.

18. A compound transistor as in claim 17 wherein said means includes bias means connected between said first source and second gate for reverse biasing said second transistor.

19. A compound transistor as in claim 17 including means for varying the internal resistance between said first and second terminals by varying a voltage across said first and third terminals to make said compound transistor a variable resistance element having a large dynamic range.

20. A compound transistor as in claim 17 wherein said means includes construction of said second transistor with a cut-off voltage lower than the pinch-off voltage of said first transistor and said first source electrode is directly connected to said second gate electrode.

* * * * *